United States Patent [19]

Kumagai

[11] Patent Number: 5,768,694
[45] Date of Patent: Jun. 16, 1998

[54] AUTOMATIC GAIN CONTROL CIRCUIT WITH INPUT AND OUTPUT SIGNAL DETECTORS OPERATING IN EQUALIZED CONDITIONS

[75] Inventor: Yoshiaki Kumagai, Kawasaki, Japan

[73] Assignee: Fujitsu Limited, Kanagawa, Japan

[21] Appl. No.: 554,039

[22] Filed: Nov. 6, 1995

[30] Foreign Application Priority Data

Mar. 20, 1995 [JP] Japan ................... 7-061362

[51] Int. Cl.$^6$ .................. H01Q 11/12; H04B 1/04
[52] U.S. Cl. ................... 455/126; 455/69
[58] Field of Search .................... 455/115, 118, 455/126, 127, 69, 249.1; 330/136, 149

[56] References Cited

U.S. PATENT DOCUMENTS

| | | | |
|---|---|---|---|
| 3,900,823 | 8/1975 | Sokal et al. | 455/126 |
| 5,208,550 | 5/1993 | Iwane | 455/126 |
| 5,265,119 | 11/1993 | Gilhousen et al. | 455/69 |
| 5,313,658 | 5/1994 | Nakamura | 455/126 |
| 5,471,654 | 11/1995 | Okazaki et al. | 455/126 |
| 5,507,016 | 4/1996 | Okuhara | 455/126 |
| 5,524,285 | 6/1996 | Wray et al. | 455/126 |
| 5,574,982 | 11/1996 | Almgren et al. | 455/69 |

*Primary Examiner*—Nguyen Vo
*Assistant Examiner*—Sam Bhattacharya
*Attorney, Agent, or Firm*—Helfgott & Karas, P.C.

[57] ABSTRACT

An AGC circuit used in radio transmitters for satellite communications and the like, which is intended to eliminate non-linearity compensators for detectors and reduce the radio transmitters in size and complexity. An RF input signal is amplified and output while passing through input splitting means, programmable attenuator, amplifier, and output splitting means. At the same time, a part of the RF input signal branches off at the input splitting means to input detecting means, where it is detected so as to obtain an input signal amplitude. In addition, a part of the amplifier output is split off at the output splitting means, then attenuated by attenuation means and finally reaches output detecting means, where the signal is detected so as to obtain an output signal amplitude after attenuation. Control means adjusts the attenuation factor of the programmable attenuator so that the input of the input detecting means will be equal to the input of the output detecting means. This structural arrangement allows both the input detecting means and output detecting means to work at the same operating point. Having well-matched detection characteristics for those two detecting means as well as the same operating point will eliminate non-linearity compensation.

4 Claims, 18 Drawing Sheets

AUTOMATIC GAIN CONTROL CIRCUIT WITH INPUT AND OUTPUT SIGNAL DETECTORS OPERATING IN EQUALIZED CONDITIONS

BACKGROUND OF THE INVENTION

1. Field of the Invention

The present invention relates to an automatic gain control (AGC) circuit to obtain a regulated gain, and more specifically, to an AGC circuit used in radio transmitters for satellite communications and the like.

2. Description of the Related Art

FIG. 14 shows an AGC circuit used in a conventional radio transmitter. Since this AGC circuit only controls the gain of a high-power amplification block that does not include any frequency conversion circuit unlike another example to be described later, its input and output signals have the same frequency f1.

As shown in FIG. 14, an RF (Radio Frequency) transmission signal is amplified while passing through a path consisting of an input signal splitter 101, a programmable attenuator 102, a high-power amplifier 103 and an output signal splitter 104, and then radiated from an antenna (not shown). A part of the RF transmission signal branches off at the input signal splitter 101 to an input signal detector 105, where the signal is detected (i.e., AM demodulated) so as to monitor an input signal amplitude. A compensator 106 compensates the input signal amplitude for affection of detection characteristics of the input signal detector 105. The details of this compensation will be described later.

Similarly, a part of the output signal of the high-power amplifier 103 branches off at the output signal splitter 104 to an output signal detector 107, where the signal is detected so as to obtain an output signal amplitude. Just as the compensator 106 does, a compensator 108 compensates the output signal amplitude for the affection of detection characteristics of the output signal detector 107.

A difference sensing circuit 109 then determines a difference between the compensated input and output signal amplitudes. This amplitude difference is proportional to the total gain of the programmable attenuator 102 and the high-power amplifier 103. A reference voltage generator 110 generates a reference voltage corresponding to a target gain which is predetermined by some other means, and provides it to a comparison unit 111. The comparison unit 111 compares the amplitude difference received from the difference sensing circuit 109 with the reference voltage and sends its result to a programmable attenuator controller 112. The programmable attenuator controller 112 controls the programmable attenuator 102 based on the received result of comparison. That is, the attenuation factor of the programmable attenuator 102 is adjusted so that the amplitude difference from the difference sensing circuit 109 will reach the reference voltage which gives a gain control command.

The above configuration allows the total gain from the input signal splitter 101 through to the output signal splitter 104 to be well regulated to the target gain, which is set at the reference voltage generator 110, by adjusting the attenuation factor of the programmable attenuator 102, even if the gain of the high-power amplifier 103 fluctuated due to a temperature shift or a secular change.

Incidentally, the input signal detector 105 and the output signal detector 107 are configured as shown in FIG. 16 and their input-output plot shows a non-linear characteristic as illustrated with a solid line 201 in FIG. 17. On the other hand, the input amplitude of the output signal detector 107 is much larger than that of the input signal detector 105. Because of this difference in the input amplitudes, the input signal detector 105 and the output signal detector 107 would work at an operating point different from each other even though they had identical detection characteristics. Due to those non-linear detection characteristics and non-equal operating points, their detected outputs will behave differently as shown in FIG. 18. That is, even if the input signals to the input signal detector 105 and the output signal detector 107 vary in the same amount of voltage $P_1$, those detectors' outputs will show different ranges $V_1$ and $V_2$, respectively. In order to avoid such a result, the compensators 106 and 108 linearize the signals detected by the input signal detector 105 and the output signal detector 107 as if they were obtained by ideal detectors having a linear input-output characteristic as illustrated with a broken line in FIG. 17. Note that FIG. 18 slightly exaggerates the non-linearity of the detectors for purposes of comprehensive illustration.

Next, another type of conventional AGC circuit is shown in FIG. 15. This AGC circuit is to regulate the gain of a high-power amplification block which includes a frequency converter, as opposed to the previously explained AGC circuit in FIG. 14. That is, its input-side signals and output-side signals in this AGC circuit have different frequencies f1 and (f1+f2), respectively. Since the AGC circuit of FIG. 15 has a basic structure identical with that of FIG. 14, the following will only explain about new items but not duplicate the descriptions for the common constituents, which are labeled with the same reference numerals as those in FIG. 14.

As shown in FIG. 15, an IF (Intermediate Frequency) signal input is amplified by an IF amplifier 114. A frequency converter 115 (labeled as "MIX" implying a mixer circuit) and a local oscillator 116, which generates a frequency f2, perform a frequency conversion of the output signal of the programmable attenuator 102.

The AGC circuit of FIG. 15 operates similarly to the AGC circuit of FIG. 14 except for differences in the frequencies of signals to be detected by the input signal detector 105 and the output signal detector 107, and in the subject to the gain control. The latter in the AGC circuit of FIG. 15 is, namely, from the input signal splitter 101 through to the output signal splitter 104 including the IF amplifier 114 and the frequency converter 115.

The above-described conventional AGC circuits incorporate the compensators 106 and 108 for linearization in order to improve reliability of the detected signal amplitudes which could be degraded by non-linearity of the input signal detector 105 and the output signal detector 107. However, having those compensators 106 and 108, the radio transmitter would become more complicated and larger in size.

In addition to above drawback, the compensators 106 and 108 may not be powerful enough to suppress any errors in the gain control when they come across a change of environmental conditions such as temperature. That is, when the temperature falls, the characteristics of the detectors will be changed as shown in FIG. 17, from a solid line 201 to a dot-and-dash line 203. Consequently, the compensators 106 and 108 will not be able to compensate with accuracy for the non-linearity of the solid line 201, which inability will result in an error in the gain control. Trying to make those compensators adaptive to any temperature ranges, however, would enlarge the scale of the compensator circuit and also cause an increase of manufacturing cost of radio transmitters. Limiting the number of applicable temperature ranges could avoid expansion of the scale, but it would simply result in too coarse compensations for non-linearity.

In addition to above problems, there is another issue concerning a frequency conversion. In the AGC circuit shown in FIG. 14, since signals to be detected by the input signal detector 105 and output signal detector 107 have the same frequency, it is possible to use the same type of detector circuits for them to have identical detection characteristics. In the AGC circuit shown in FIG. 15, in contrast to FIG. 14, because the input signal detector 105 and output signal detector 107 deal with the signals having different frequencies (f1 is 140 MHz while f1+f2 ranges from 5 to 15 GHz, for example), the detection characteristics of those detectors will never be identical. This will cause another type of error in the gain control which could happen even if there was no temperature change, and the non-linearity compensation would not help. Temperature change, of course, will add more error.

SUMMARY OF THE INVENTION

Taking the above into consideration, a first object of the present invention is to provide an AGC circuit which will reduce the scale of radio transmitter equipment by eliminating compensators for non-linearity of detectors.

Further, a second object of the present invention is to provide an AGC circuit which will offer an accurate gain control adaptive to any change of operating conditions such as temperature shifting.

Still further, a third object of the present invention is to provide an AGC circuit which will provide accurate gain control applicable to such amplifiers that incorporates a frequency conversion block.

To accomplish the above objects, according to the present invention, there is provided an AGC circuit to obtain a regulated gain, which comprises the following elements. Input splitting means splits off an input sample signal from an input signal passing therethrough. A programmable attenuator attenuates the input signal that arrived therein passing through the input splitting means. An amplifier amplifies the input signal attenuated by the programmable attenuator. Output splitting means splits off an output sample signal from an output signal of the amplifier. Attenuation means attenuates the output sample signal provided by the output splitting means and thereby outputs an attenuated output sample signal. Output detecting means detects the attenuated output sample signal and thereby outputs an output detection signal. Input detecting means, coupled to the input splitting means, detects the input sample signal and thereby outputs an input detection signal. Lastly, control means coupled to the programmable attenuator, the input detecting means and the output detecting means, controls an attenuation factor of the programmable attenuator based on the input detection signal and the output detection signal so that the input sample signal and the attenuated output sample signal will have equal signal amplitudes.

There is also provided another AGC circuit which comprises the following structural elements. Input splitting means splits off an input sample signal from an input signal passing therethrough. A programmable attenuator attenuates the input signal passed through the input splitting means. A frequency converter converts a first frequency of the input signal attenuated by the programmable attenuator to a second frequency. An amplifier amplifies the input signal converted to the second frequency by the frequency converter and thereby outputs an output signal having the second frequency. Output splitting means splits off an output sample signal from the output signal from the amplifier. Attenuation means for attenuating the output sample signal and thereby outputting an attenuated output sample signal. Frequency reconversion means reconverts frequency of the attenuated output sample signal to the first frequency. Output detecting means detects the attenuated output sample signal reconverted to the first frequency by the frequency reconversion means and thereby outputting an output detection signal. Input detecting means, coupled to the input splitting means, detects the input sample signal and thereby outputs an input detection signal. Lastly, control means, coupled to the programmable attenuator, the input detecting means and the output detecting means, controls an attenuation factor of the programmable attenuator based on the input detection signal and the output detection signal, so that the input sample signal and the attenuated output sample signal will have equal signal amplitudes.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

An embodiment of the present invention will be described below with reference to the drawings.

Figure 1:
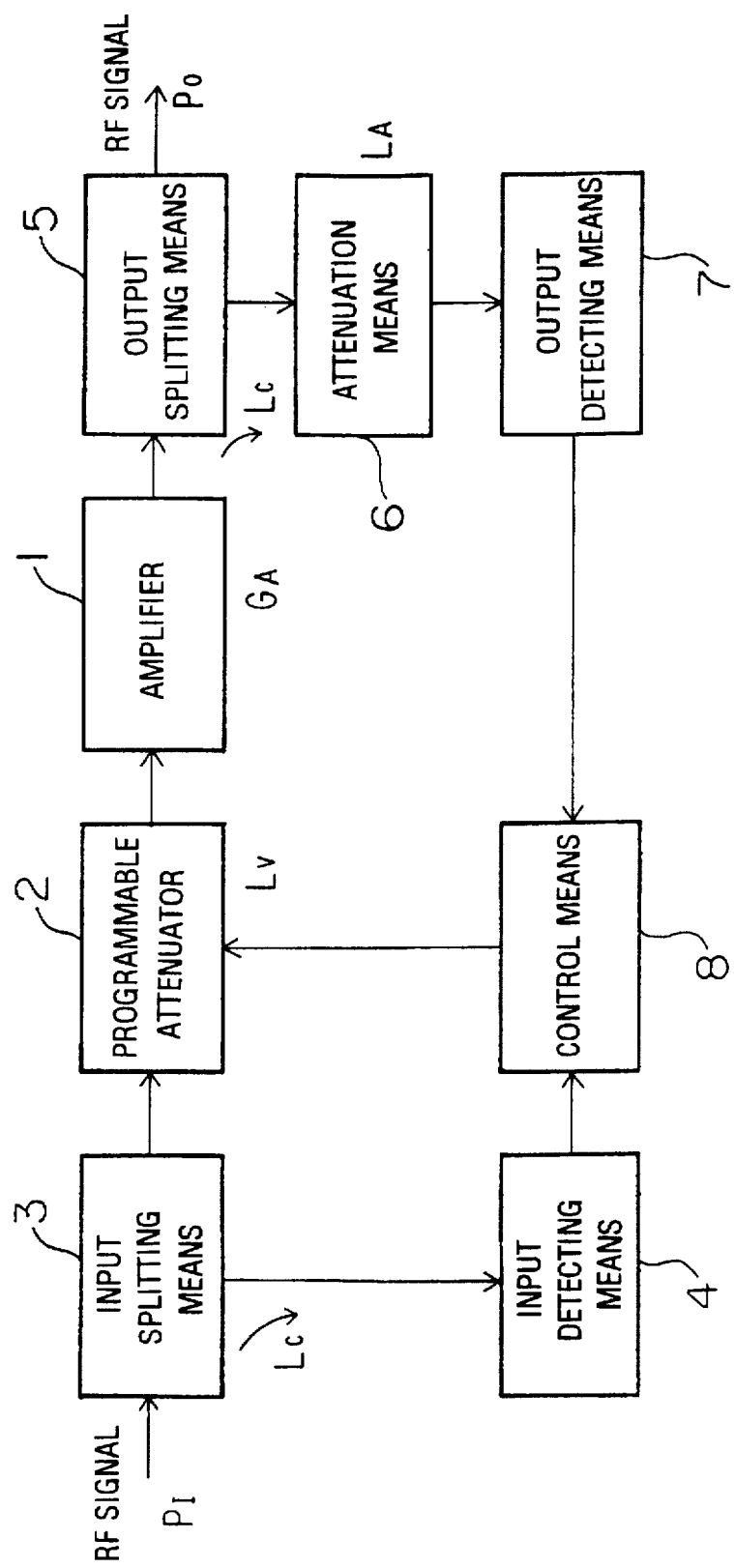
FIG. 1 is a first conceptual view of the present invention.

First, FIG. 1 outlines a first embodiment of the present invention, which is an AGC circuit where an RF signal amplifier for radio transmitter is the only subject to the gain control. The AGC circuit of the first embodiment comprises the following constituents: an amplifier 1, a programmable attenuator 2 coupled to the input of the amplifier 1, input splitting means 3 for partially splitting off a signal from an input signal passing through to the programmable attenuator 2, input detecting means 4 for detecting the signal split off by the input splitting means 3, output splitting means 5 for partially splitting off a signal from the output of the amplifier 1, attenuation means 6 for attenuating the signal split off by the output splitting means 5, output detecting means 7 for detecting the output of the attenuation means 6, and control means 8 which controls the attenuation factor of the programmable attenuator 2 based on the outputs of the input detecting means 4 and output detecting means 7 so that the inputs of the input detecting means 4 and the output detecting means 7 will have the same signal amplitude.

In such a structural arrangement as shown in FIG. 1, an RF signal input thereto is amplified and output while passing through a path consisting of the input splitting means 3, the programmable attenuator 2, the amplifier 1, and the output splitting means 5. At the same time, a part of the RF signal branches off at the input splitting means 3 to the input detecting means 4, where it is detected (i.e., AM demodulated) so as to obtain an input signal amplitude. In addition, a part of the output signal is split off at the output splitting means 5, then attenuated by the attenuation means 6 and finally reaches the output detecting means 7, where the signal is detected so as to obtain an output signal amplitude after attenuation.

The control means 8 adjusts the attenuation factor $L_V$ of the programmable attenuator 2 so that the input of the input detecting means 4 will be equal to the input of the output detecting means 7 in their amplitude, namely, so as to satisfy the following Equation (1).

$$P_I - L_C = P_I - L_V + G_A - L_C - L_A \quad (1)$$

where $P_I$ is power of the input signal, $L_V$ is attenuation factor of the programmable attenuator 2, $G_A$ is gain of the amplifier 1, $L_C$ is each coupling loss of the input splitting means 3 and the output splitting means 5, and $L_A$ is attenuation factor of the attenuation means 6. Note that all those variables are positive values logarithmically expressed in units called decibels.

The following Equation (2) is obtained by rearranging Equation (1).

$$L_V = G_A - L_A \quad (2)$$

This equation means that, when the control means 8 adjusts the attenuation factor $L_V$ of the programmable attenuator 2 to be ($G_A - L_A$), the inputs of the input detecting means 4 and the output detecting means 7 will have the same amplitude and the operating points of those detecting means will match with each other. Non-linearity compensation is no longer necessary under such conditions that the input detecting means 4 and the output detecting means 7 are detectors having the same detection characteristics and they work at the equalized operating point. Furthermore, even a change in their environmental conditions as temperature and the like will never degrade the accuracy of gain control, since such a change will affect the detection characteristics of both of the input detecting means 4 and the output detecting means 7 in the same way, which will cancel the effect of output drift due to the environmental change.

The total gain of the path from the input splitting means 3 through to the output splitting means 5 is expressed in the following Equation (3).

$$P_O - P_I = G_A - L_V \quad (3)$$

where $P_O$ is power of the output signal.

Substitution of Equation (2) into Equation (3) yields $$P_O - P_I = L_A \quad (4)$$

Above equations indicate that the total gain from the input splitting means 3 to the output splitting means 5 can be regulated to a constant value $L_A$, if the control means 8 always controls the attenuation factor $L_V$ of the programmable attenuator 2 to be ($G_A - L_A$) according to a fluctuation of gain $G_A$ of the amplifier 1 due to a temperature shift or secular change.

In addition, the total gain ($P_O - P_I$) from the input splitting means 3 to the output splitting means 5 can be set to any value by making the attenuation factor $L_A$ of the attenuation means 6 variable.

The following will describe in detail the first embodiment of the present invention.

Figure 3:
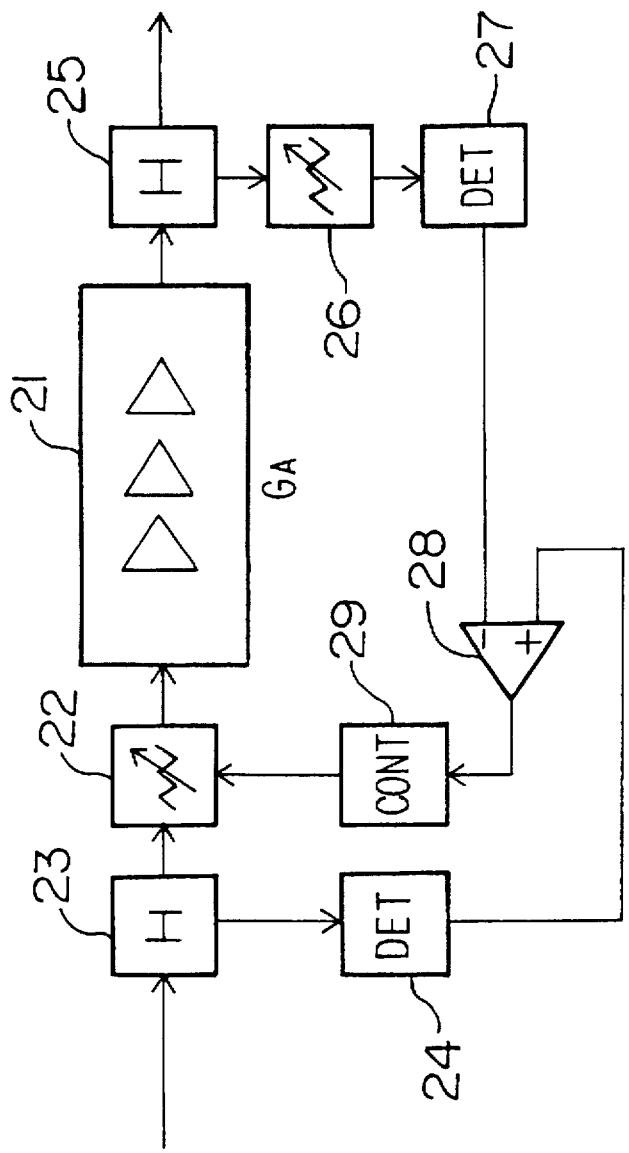
FIG. 3 is a schematic diagram to show a first embodiment.
Figure 16:
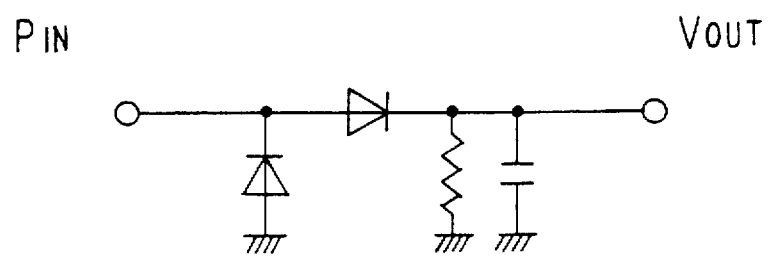
FIG. 16 is a schematic diagram of a detector.

FIG. 3 is a block diagram to show a detailed structural arrangement of the first embodiment. A high-power amplifier 21 in FIG. 3 works as the amplifier 1 in FIG. 1, and similarly, a programmable attenuator 22 as the programmable attenuator 2, an input signal splitter 23 as the input splitting means 3, an input signal detector 24 as the input detecting means 4, an output signal splitter 25 as the output splitting means 5, an attenuation means 26 as the attenuation means 6, an output signal detector 27 as the output detecting means 7, and a combination of a difference sensing circuit 28 and a programmable attenuator controller 29 as the control means 8. The attenuator 26 is an attenuator composed of passive elements, whose attenuation factor can be selectable by manual. The input signal detector 24 and the output signal detector 27 are configured as shown in FIG. 16 and they have identical detection characteristics as shown in the input-output plot in FIG. 17. The difference sensing circuit 28 monitors a difference in output amplitudes of the input signal detector 24 and the output signal detector 27. The programmable attenuator controller 29 controls the attenuation factor of the programmable attenuator 22 so that the difference will be reduced, namely, adjusting attenuation factor $L_V$ to satisfy Equation (2).

Figure 14:
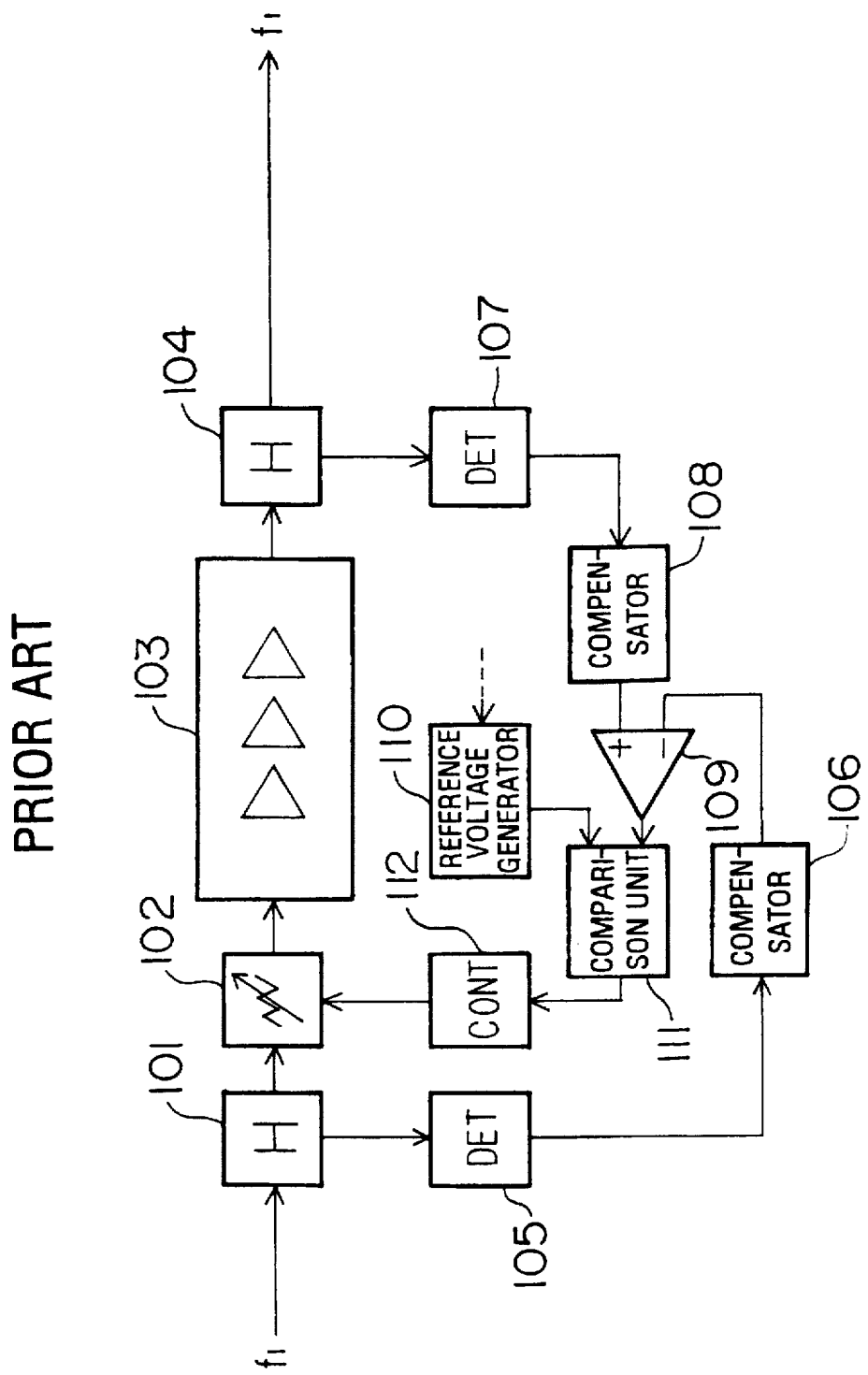
FIG. 14 is a schematic diagram of a first conventional AGC circuit.
Figure 15:
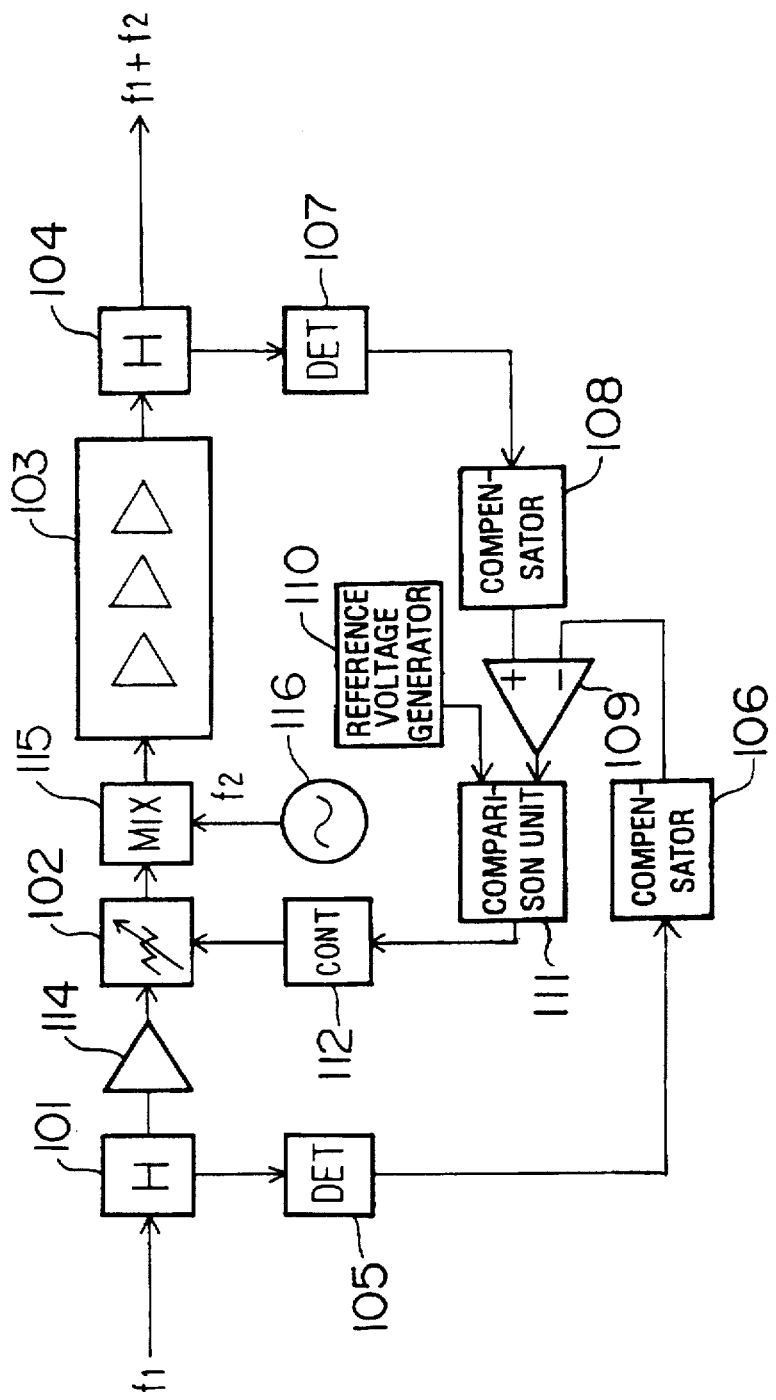
FIG. 15 is a schematic diagram of a second conventional AGC circuit.

The attenuator 26 is composed of passive elements and its attenuation factor is manually selectable. On the other hand, the conventional AGC circuits as shown in FIGS. 14 and 15 are designed so that any desired gain can be obtained by arbitrarily setting a reference voltage generated by the reference voltage generator 110. Since the reference voltage generator 110 and comparison unit 111 consist of active elements, they are easily affected by a temperature change or a secular change and this nature will cause an error in the gain control. In contrast to this, the above-described first embodiment makes up the attenuator 26 from passive elements which are stable toward a temperature change or a secular change, and therefore, it is possible to control gain with less error. Suitable embodiments of such a passive attenuator device with a manual-selectable attenuation factor include a fixed attenuator configured to be replaceable to other ones and a step attenuator.

Next, a second embodiment will be explained.

Figure 4:
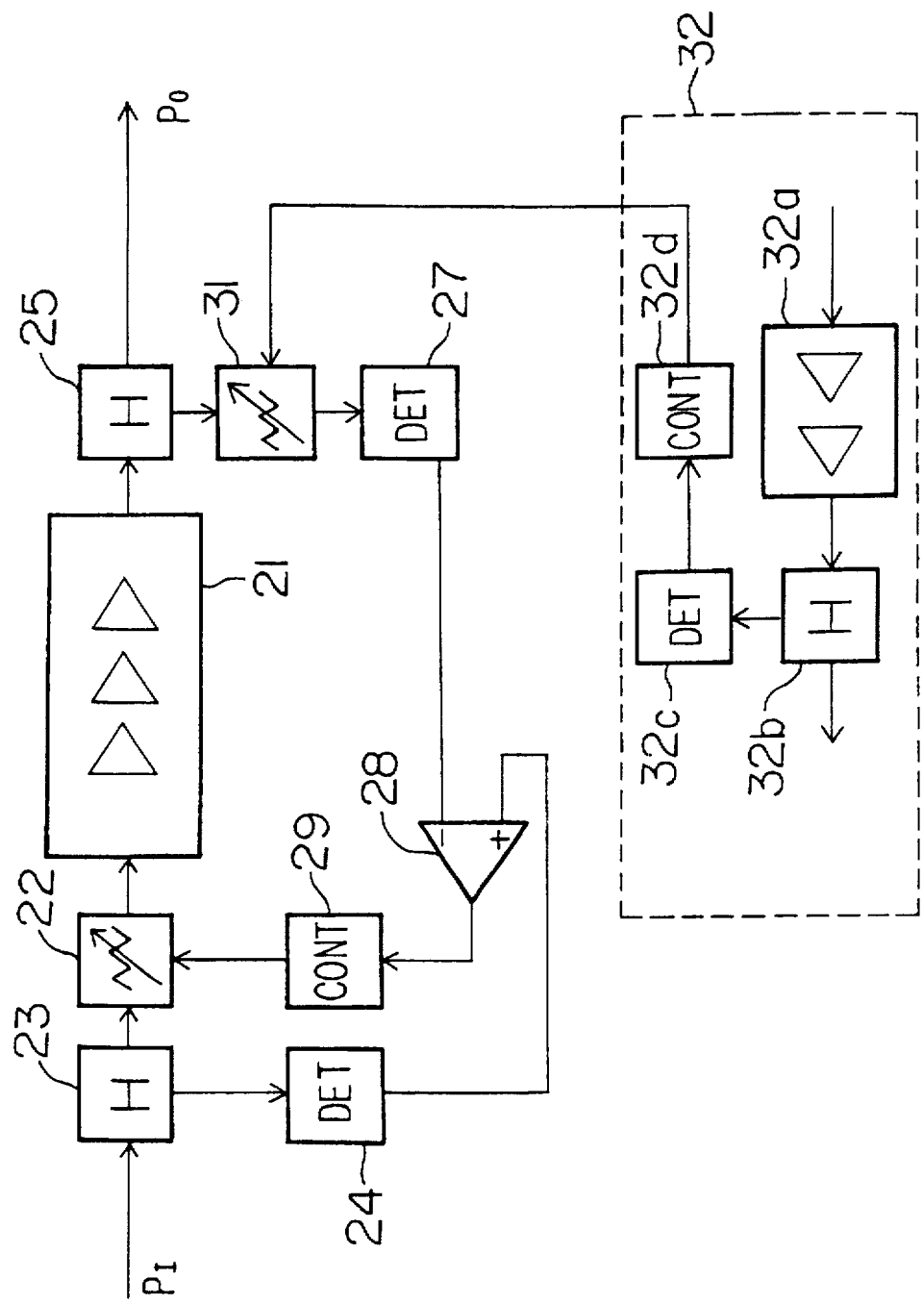
FIG. 4 is a schematic diagram to show a second embodiment.

FIG. 4 is a block diagram showing a structure of the second embodiment, which is an AGC circuit used in a radio transmitter for satellite communications. Because the second embodiment has a structure basically identical with the aforementioned first embodiment, the following will only explain new elements but not duplicate the descriptions for the common constituents labeled with the same reference numerals as before.

In the second embodiment, a programmable attenuator 31 takes place of the attenuator 26 in the first embodiment and a transmission power controller (TPC) 32 is newly added. The transmission signal in satellite communications is subject to atmospheric absorption mainly by rain. If an earth station has detected an increase of propagation loss by monitoring the strength or carrier-to-noise (C/N) ratio of a received satellite signal, it will enhance the transmission power to compensate for the loss. Accurate control is here required not to make a satellite transponder saturated by sending too strong transmission signals. This kind of transmission output control is realized by the transmission power controller 32, which is provided with an IF signal from a receiver unit via a frequency converter (either not shown) for receiving signals from satellite transponders. Inside the transmission power controller 32, the IF signal goes through an IF amplifier 32a and a splitter 32b, and finally reaches a detector 32c where a receiver signal amplitude is detected. The controller 32d adjusts the programmable attenuator 31 according to the detected receiver signal amplitude. To be more specific, the controller 32d will raise the attenuation factor $L_A$ of the programmable attenuator 31 in order to increase the gain $(P_O-P_I)$ from the input signal splitter 23 through to the output signal splitter 25, when the receiver signal amplitude has dropped due to an increased propagation loss. Appropriate amount of this gain enhancement should be previously determined by some experiments so as to avoid any saturation of transponder. The controller 32d adjusts the programmable attenuator 31 in reference to this predetermined data.

Next, a third embodiment will be described.

Figure 5:
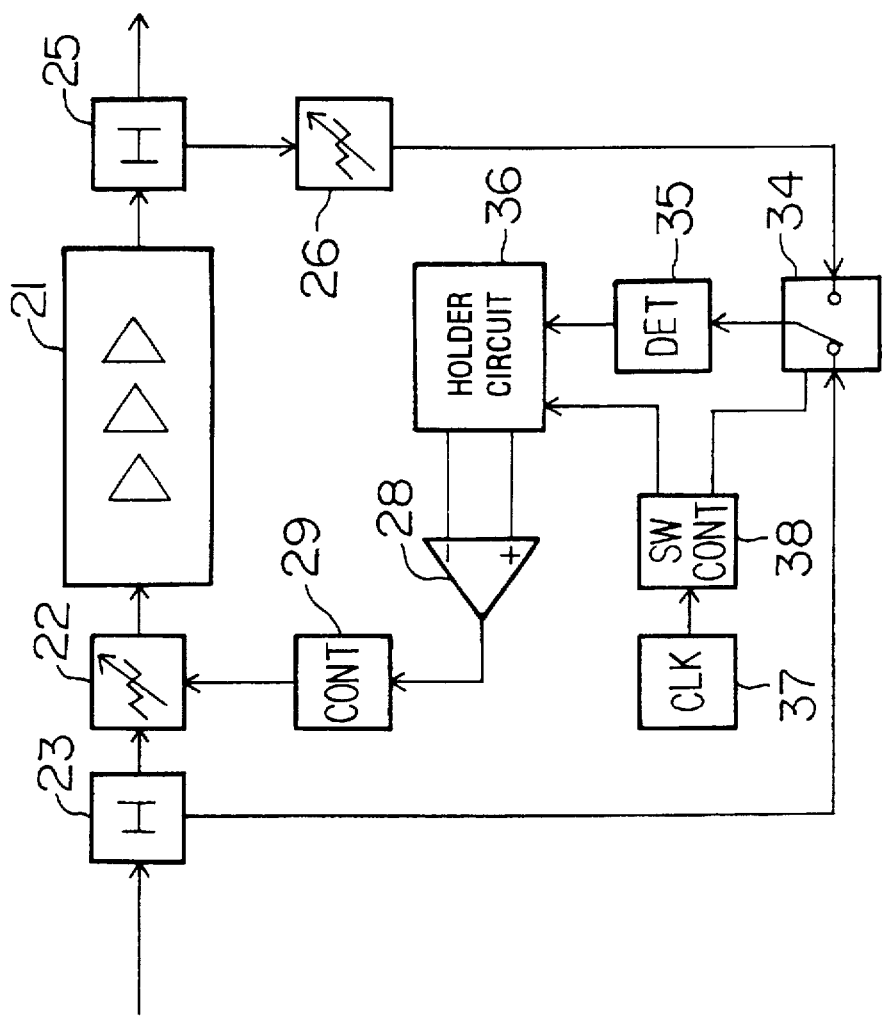
FIG. 5 is a schematic diagram to show a third embodiment.

FIG. 5 is a block diagram to show a structural arrangement of the third embodiment. The first embodiment shown in FIG. 3 essentially requires that the input signal detector 24 and the output signal detector 27 be identical in their detection characteristics. However, it is difficult to satisfy that requirement because there actually exists a kind of individuality, or a difference in the detection characteristics due to variations in electrical properties with components to be used in the detector. To solve this problem, an AGC circuit of the third embodiment is configured such that a single detector detects both input and output signal amplitudes. Since the third embodiment has a structure basically identical with the aforementioned first embodiment, the following will only explain about new elements but not duplicate the descriptions for the common constituents labeled with the same reference numerals as before.

In the third embodiment of the present invention, output signals from the input signal splitter 23 and the attenuator 26 are input to a selection switch 34. The selection switch 34 is provided with a selection signal from a selection signal generator 38 (labeled in FIG. 5 as "SW CONT" implying "switching control"). The selection signal generator 38 generates the selection signal at a predetermined interval $T_1$ based on a clock signal supplied by a clock generator 37. The selection switch 34 alternately selects one of the output signals from the input signal splitter 23 and attenuator 26 according to the selection signal and sends it to a detector 35. The detector 35 detects this switched signal to obtain its amplitude and sends it to a holder circuit 36. The holder circuit 36 incorporates two memorizing circuits corresponding to the outputs of the input signal splitter 23 and attenuator 26, and is provided with the selection signal by the selection signal generator 38. In synchronization with the selection signal, each of the two memorizing circuits in the holder circuit 36 memorizes the corresponding signal amplitude as well as updating the signal amplitudes held therein with newly sampled ones. The difference sensing circuit 28 reads out the contents in the memorizing circuits and detects a difference in their levels.

This structural arrangement where the detector 35 solely detects both signal amplitudes solves the problem due to different individualities of detectors which was revealed in the first embodiment. Regarding the selection signal generated by the selection signal generator 38, its predetermined time interval $T_1$ can be on the order of a second because the temperature drift of amplifier gain is what the AGC circuit aims at as a main target of control.

Next, a fourth embodiment will be described below.

Figure 6:
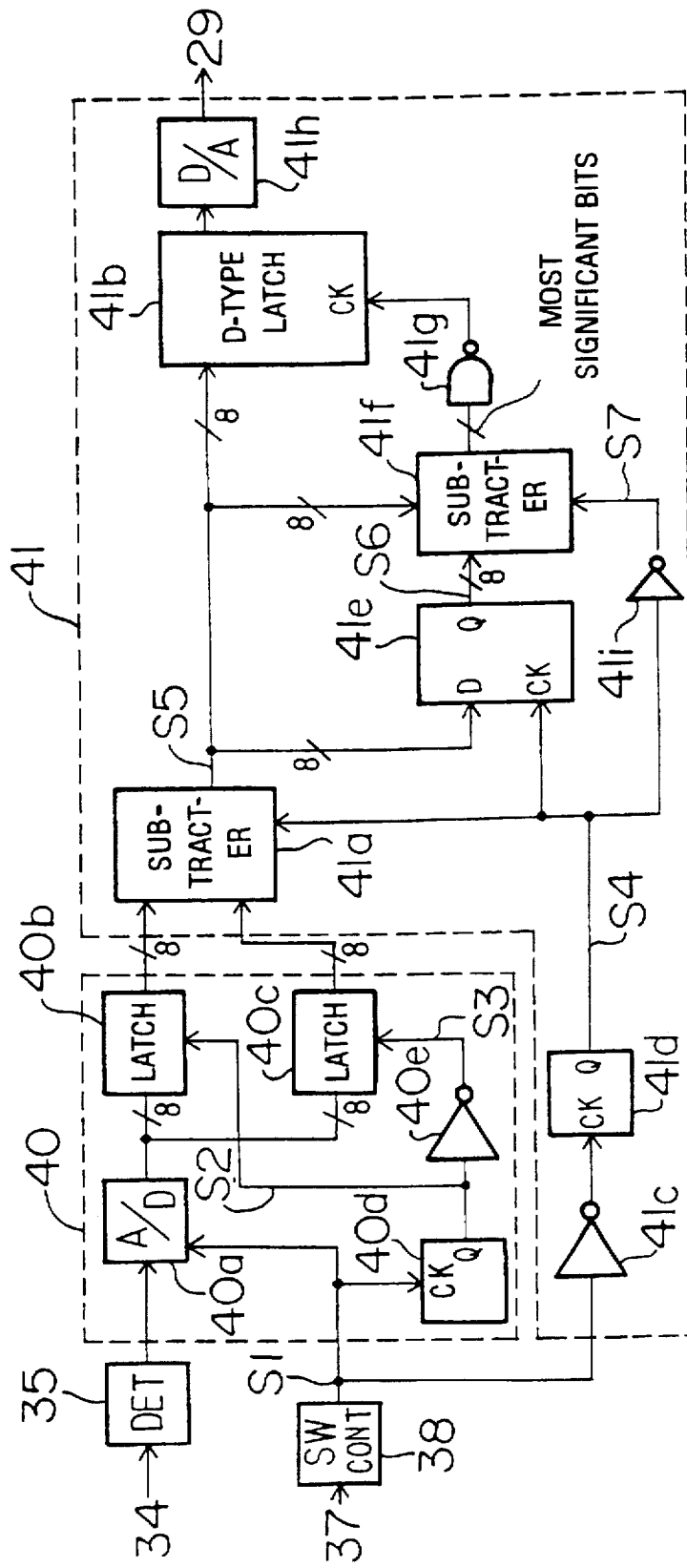
FIG. 6 is a schematic diagram to show a fourth embodiment.

FIG. 6 is a block diagram that schematically shows the fourth embodiment. An AGC circuit illustrated therein is designed for a radio transmitter with a Single Channel Per Carrier (SCPC) system using a voice-activation technique. In a system where the number of transmission waves to be input to the transmitter may vary depending on time, the AGC circuit of the third embodiment would possibly encounter such a situation that the number of transmission waves at the time of sampling the input signal amplitude is different from that at the time of sampling the output signal amplitude, because the AGC circuit does not sample the both signals simultaneously. The difference in the number of transmission waves will, of course, cause a large shift of the signal amplitude. Gain control based on such a signal amplitude would result in malfunctions such as sudden and severe fluctuations of the gain. The fourth embodiment, therefore, monitors the amplitude difference detected by the difference sensing circuit 28 and recognizes a sudden transition thereof as a change of the number of transmission waves, which disables the gain control in accordance with the detected amplitude difference.

Because this fourth embodiment has a structure basically identical with the aforementioned third embodiment, FIG. 6 only illustrates new elements and other relating parts. Among the elements shown in FIG. 6, those being common to the third embodiment are labeled with the same reference numerals as before, whose descriptions are also to be omitted unless they have any differences.

Figure 8:
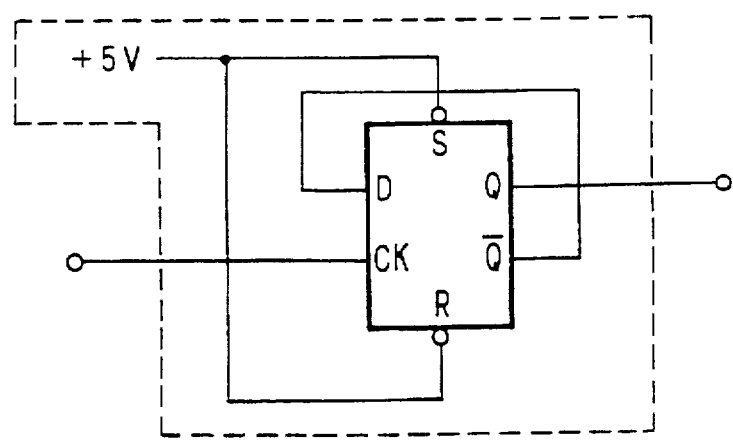
FIG. 8(A) is a circuit diagram of D-type flip-flops 40d and 41d in FIG. 6.
FIG. 8(B) shows signal waveforms of the D-type flip-flops 40d and 41d in FIG. 6.
Figure 8:
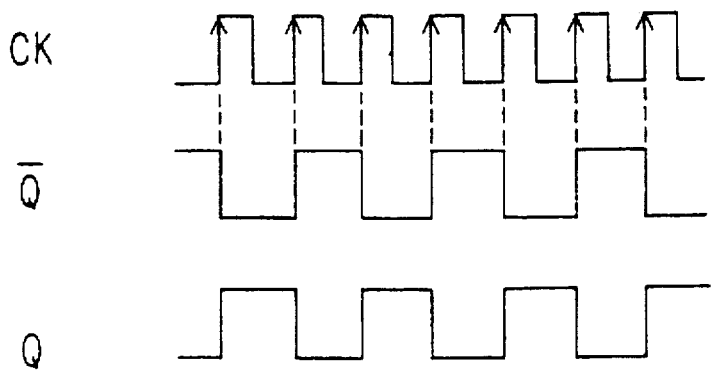

The fourth embodiment uses a digital holder circuit 40 and a difference monitoring circuit 41 which substitute the holder circuit 36 and difference sensing circuit 28, respectively, of the third embodiment. The digital holder circuit 40 comprises an analog-to-digital (A/D) converter 40a, two latches 40b and 40c, a D-type flip-flop 40d, and an inverter 40e. The difference monitoring circuit 41 is organized with a subtracter 41a, a D-type latch 41b, an inverter 41c, D-type flip-flops 41d and 41e, a subtracter 41f, a NAND gate 41g, a digital-to-analog (D/A) converter 41h, and an inverter 41i. Both the D-type flip-flops 40d and 41d have the same circuit as illustrated in FIG. 8(A), whose signal waveforms are shown in FIG. 8(B).

Figure 7:
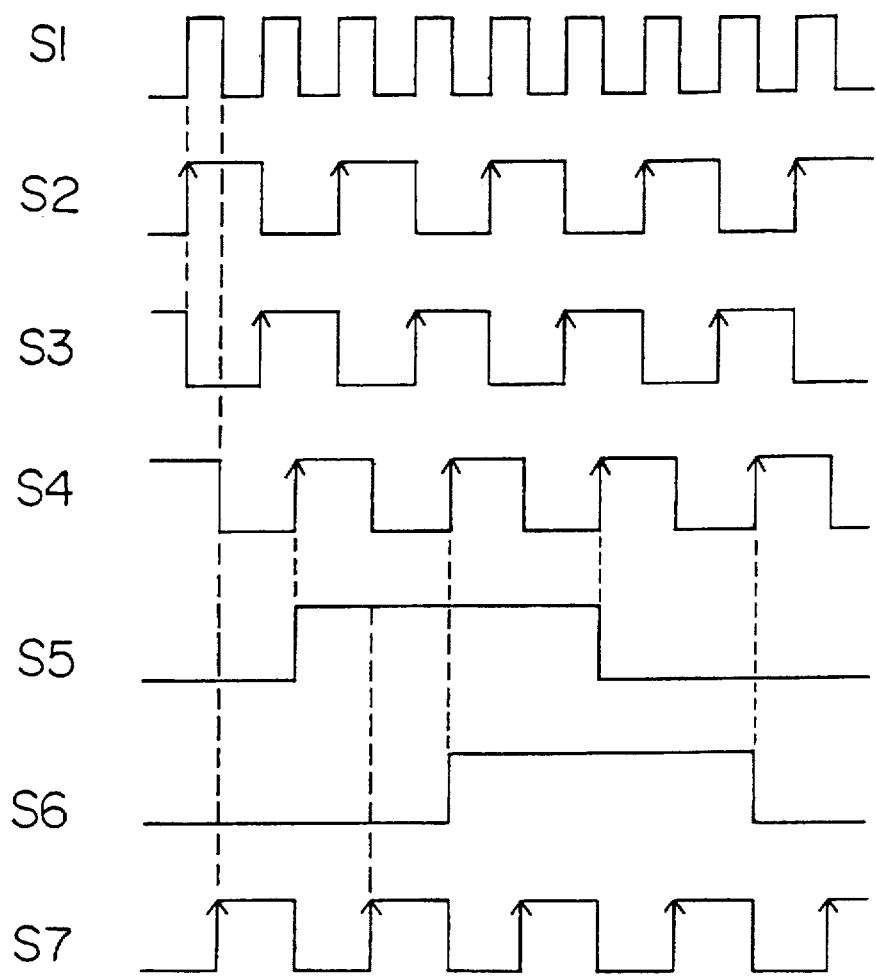
FIG. 7 is a timing chart to show respective signals in the fourth embodiment.

Operations of the digital holder circuit 40 and difference monitoring circuit 41 will be described below with reference to a time chart in FIG. 7.

The signals alternately sent from the detector 35 are set to the latches 40b and 40c, being converted by the A/D converter 40a into 8-bit digital data. On the other hand, the selection signal S1 is input to the D-type flipflop 40d, which converts it to signal S2 for clock input of the latch 40b. Signal S3, which is obtained via the inverter 40e as an inverted signal of signal S2, drives the clock input of the latch 40c. The latches 40b and 40c latch their inputs at every rising edge of the clock signals S2 and S3, respectively, and provide the subtracter 41a with their latched outputs in 8-bit parallel data form.

The selection signal S1 is sent from the selection signal generator 38 to the D-type flip-flop 41d via the inverter 41c, where signal S1 is converted to signal S4. Signal S4 is used as a clock signal for the subtracter 41a as well as for the D-type flip-flop 41e, and also used as another clock signal S7 for the subtracter 41f being inverted by the inverter 41i. The subtracter 41a subtracts the output of the latch 40c from the output of the latch 40b at every rising edge of signal S4. Signal S5, which is output from the subtracter 41a and actually indicates a difference between the outputs of the input signal splitter 23 and the attenuator 26, would not show by nature any sudden and intense transition. If such a transition is observed, there must have been a change of the number of transmission carriers somewhere between two timings at which the detector 35 sampled the outputs from the input signal splitter 23 and the output of the attenuator 26. In order to detect this sudden and intense transition of signal S5 of the subtracter 41a, the D-type flip-flop 41e delays the 8-bit signal S5 for one sampling period and puts it to the subtracter 41f, thereby checking if there is any change in the bits thereof. Then the most significant two bits in the absolute output of the subtracter 41f are sent to the NAND gate 41g. That is, since some significant output bits of the subtracter 41f are expected to become "1" when the signal S5 makes a big transition, the most significant two bits, for example, are sent to the NAND gate 41g. As a result, an intense transition of the signal S5 that sets the most significant two bits of the subtracter 41f to "1" will drive the clock input of the D-type latch 41b to low, thus holding the output of the D-type latch 41b at the value set before the intense transition of signal S5 occurred. Consequently, only moderate transitions of signal S5, which is subject to the gain control, can propagate to the programmable attenuator controller 29 via the D/A converter 41h. Incidentally, the signal shown in FIG. 7 as named S5 is one bit out of the 8-bit output of the subtracter 41a.

Next, a fifth embodiment will be described below.

Figure 9:
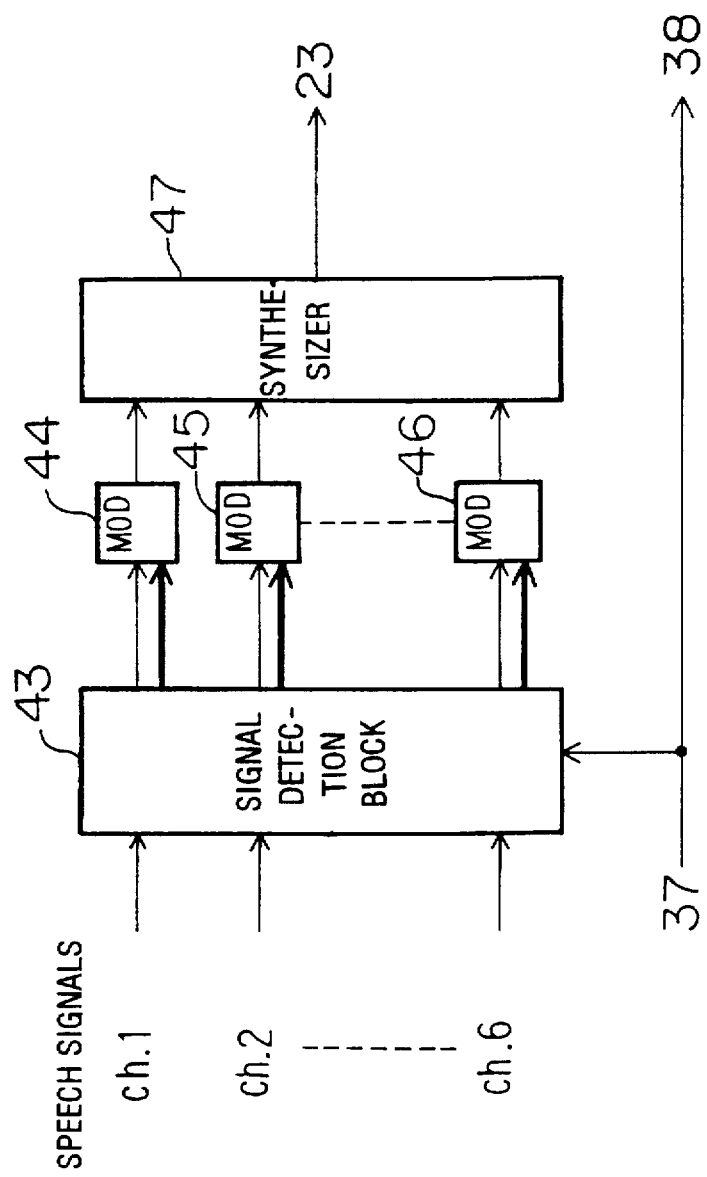
FIG. 9 is a schematic diagram to show a fifth embodiment.

FIG. 9 is a block diagram that shows a structure of the fifth embodiment. An AGC circuit of this fifth embodiment is also designed for a radio transmitter with an SCPC system using a voice-activation technique. The fifth embodiment provides another solution to avoid malfunctions of the gain control due to variations in the number of transmission waves. For that purpose, the fourth embodiment introduced another technique of monitoring the amplitude difference detected by the difference sensing circuit 28 in the third embodiment.

Since this fifth embodiment also has a structure basically identical with the aforementioned third embodiment, FIG. 9 only illustrates new elements and other relating parts. Among the elements shown in FIG. 9, those being common to the third embodiment are labeled with the same reference numerals as before, whose descriptions are to be omitted unless they have any differences.

In the fifth embodiment, a plurality of speech signals to be transmitted, say six channels, are separately modulated by a plurality of modulators 44 through 46. Those modulated signals are then synthesized into one signal by a synthesizer 47 and sent to the input signal splitter 23. In this process, the six-channel speech signals are first provided to the signal detection block 43, which operates in synchronization with the clock signal from the clock generator 37 and selectively activates the modulators corresponding to the channels where voice signals are available (i.e., voice activation technique). Accordingly, the synthesizer 47 receives limited number of carriers from the modulators 44-46 only when there are voice signals available on the respective channels, and this results in a regular change of the number of carriers to be synthesized and output (i.e., the number of input waves varies from the viewpoint of the input signal splitter 23).

Figure 10:
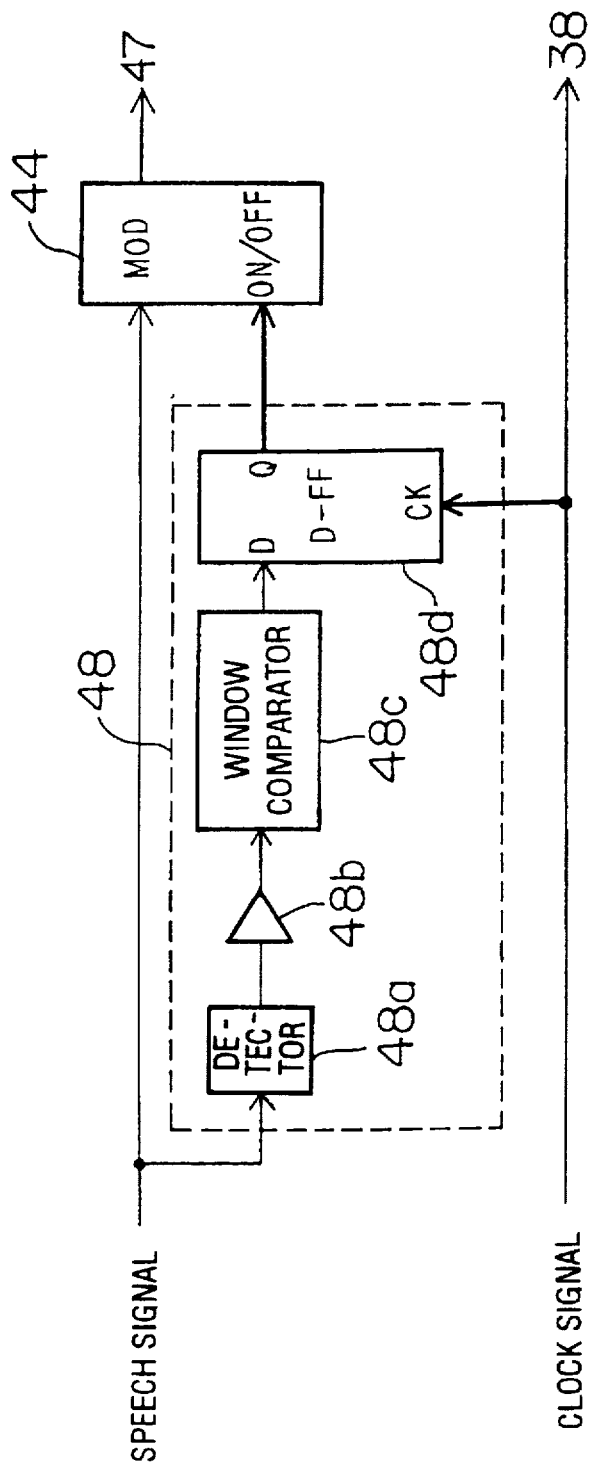
FIG. 10 shows internal structure of a signal detection block.

FIG. 10 shows internal structure of the signal detection block 43. FIG. 10 only shows a specific part 48 for channel 1 (Ch. 1), however, those for the other channels (not shown) must have the same structure. The part 48 for channel 1 comprises a detector 48a, an amplifier 48b, window comparator 48c, and a D-type flip-flop 48d. The D-type flip-flop 48d is clocked by a clock signal from the clock generator 37 and its Q-output is wired to the ON/OFF input of the modulator 44. The modulator 44 generates its output modulated by the speech signal only when the ON/OFF input is driven high.

Figure 11:
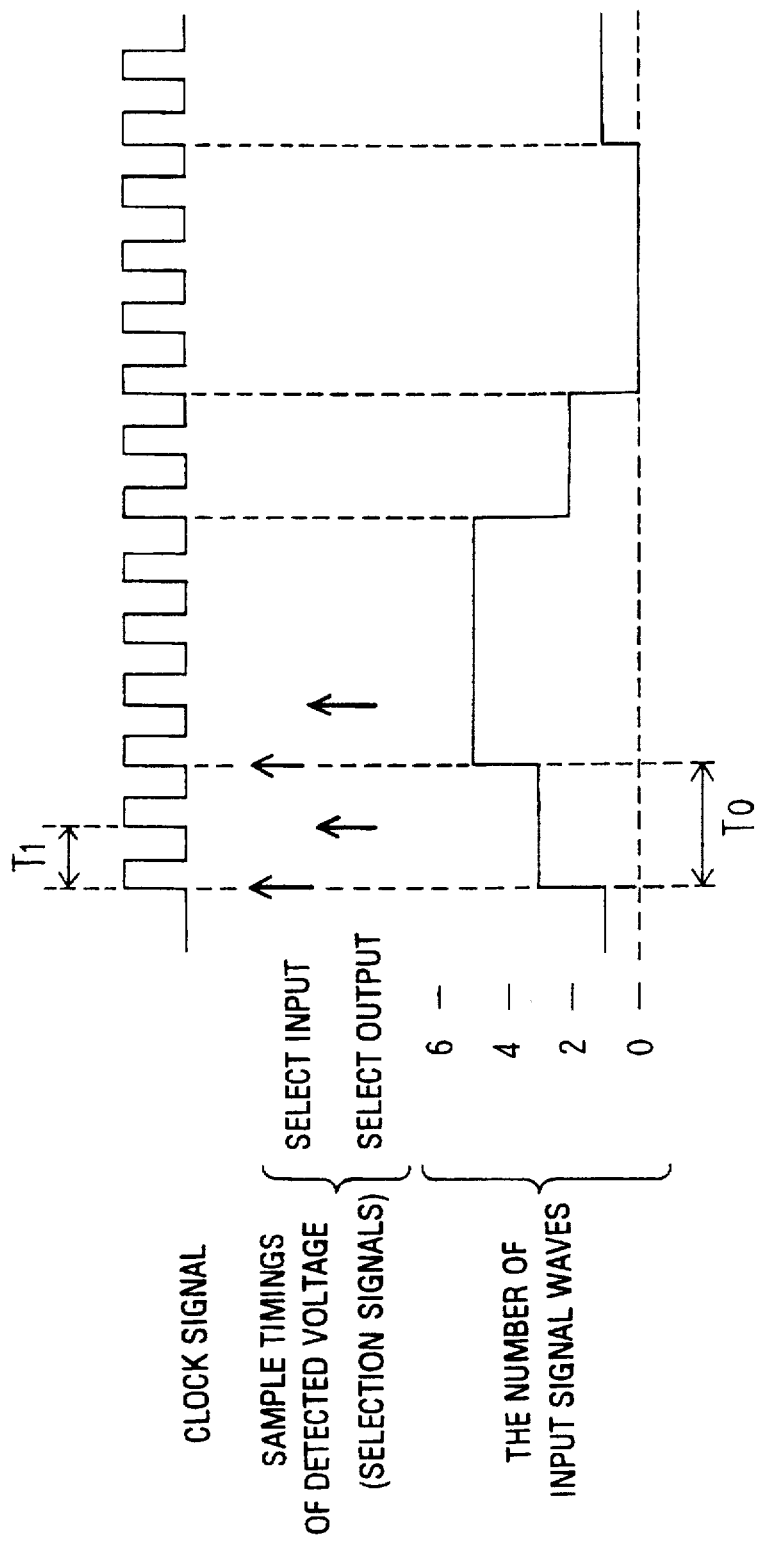
FIG. 11 describes operations of the fifth embodiment.

Operations of the fifth embodiment having above structure will described below with reference to FIG. 11.

The clock generator 37 generates a clock signal being cycled for $T_1$ that is set to a shorter time than a minimum cycle time $T_0$ of transitions of the number of input waves (or a minimum duration of one set of waves). Upon reception of this clock signal, the selection signal generator 38 generates the selection signal in synchronization with the clock signal, as described before, and thereby drives the selection switch 34 so that it will alternately samples the outputs of the input signal splitter 23 and the attenuator 26.

On the other hand, the D-type flip-flop 48d is sensing a speech signal at every rising edge of the clock signal and, if detected, outputs a high-level signal from its Q-output terminal. Consequently, the number of transmission waves output from the synthesizer 47 varies in synchronization with the clock signal. Since the minimum cycle time $T_0$ of transitions in the number of input waves is longer than the clock cycle $T_1$ as mentioned before, it is possible to finish a set of signal samplings for the input signal splitter 23 and attenuator 26 within the period $T_0$, thus avoiding malfunctions of the gain control.

Further, a sixth embodiment will be described below. The sixth embodiment is an AGC circuit applicable to a radio transmitter in which a frequency converter and an RF signal amplifier are under the gain control.

Figure 2:
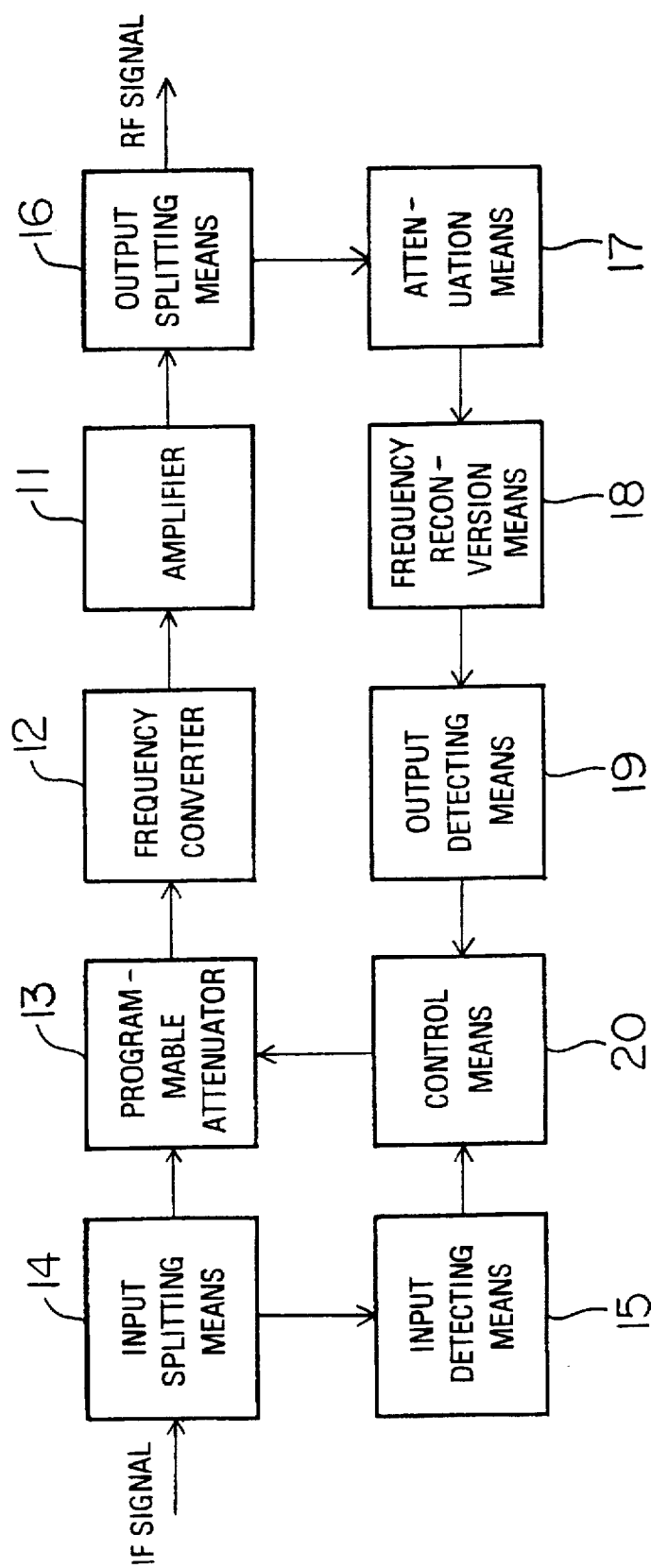
FIG. 2 is a second conceptual view of the present invention.

The explanation starts with outlines of the sixth embodiment with reference to FIG. 2. The sixth embodiment comprises the following elements: an amplifier 11, a frequency converter 12 coupled to the input of the amplifier 11, a programmable attenuator 13 coupled to the input of the frequency converter 12, input splitting means 14 for partially splitting off a signal from an input signal passing through to the programmable attenuator 13, input detecting means 15 to detect the signal split off by the input splitting means 14, output splitting means 16 for partially splitting off a signal from the output of the amplifier 11, attenuation means 17 to attenuate the signal split off by the output splitting means 16, frequency reconversion means 18 to reconvert the output signal of the attenuation means 17 back to the frequency before conversion by the frequency converter 12, output detecting means 19 to detect the output of the frequency reconversion means 18, control means 20 to control the attenuation factor of the programmable attenuator 13 based on the outputs of the input detecting means 15 and the output detecting means 19 so that the inputs of the input detecting means 15 and the output detecting means 19 will both have the same signal amplitude.

In such a structural arrangement as shown in FIG. 2, there is a forward path consisting of the input splitting means 14, the programmable attenuator 13, the frequency converter 12, the amplifier 11, and the output splitting means 16. An IF signal that is input thereto will be converted to an RF signal with a radio frequency, then amplified and finally output while passing through that forward path. On the other hand, a part of the IF input signal branches off at the input splitting means 14 and detected by the input detecting means 15 to obtain an input signal amplitude. In addition, a part of the RF output signal is split off by the output splitting means 16, attenuated by the attenuation means 17, reconverted by the frequency reconversion means 18 back to a previous intermediate frequency (IF) signal and detected by the output detecting means 19 to obtain an output signal amplitude after attenuation. Thanks to the frequency reconversion means 18, the frequency of the output-side signal to be detected by the output detecting means 19 coincides with that of the input-side signal to be detected by the input detecting means 15, and this equalized-frequency scheme allows those detecting means to have the same detection characteristics. Furthermore, since the control means 20 regulates the programmable attenuator 13 so as to make the two inputs of the input detecting means 15 and the output detecting means 19 equal to each other, the operating points of those two detecting means will be also equalized in the same way as the structure shown in FIG. 1, thus eliminating a compensation for non-linearity.

More specific description for the sixth embodiment will be provided as follows.

Figure 12:
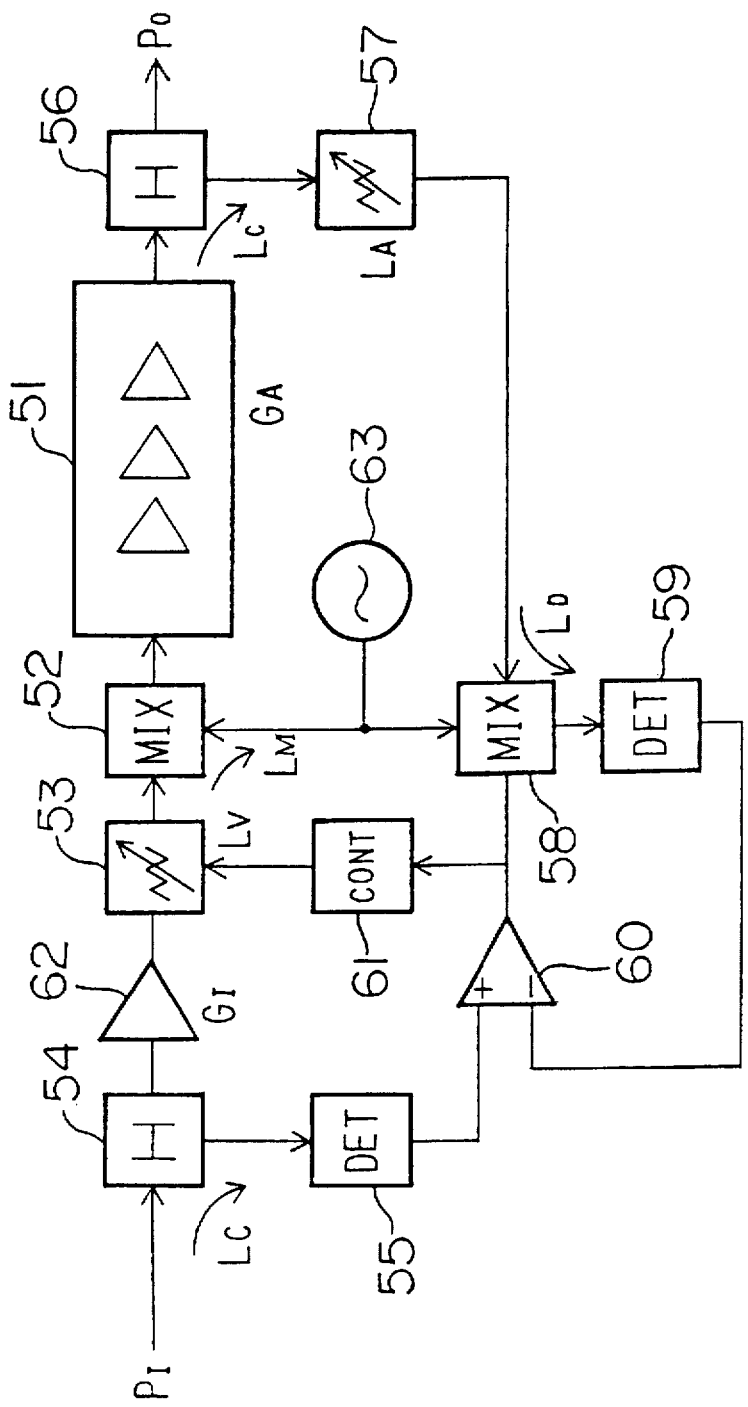
FIG. 12 is a schematic diagram to show a sixth embodiment.
Figure 17:
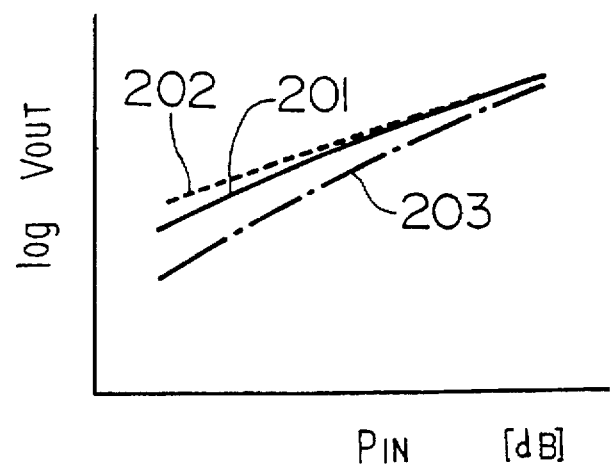
FIG. 17 shows characteristics of a detector.
Figure 18:
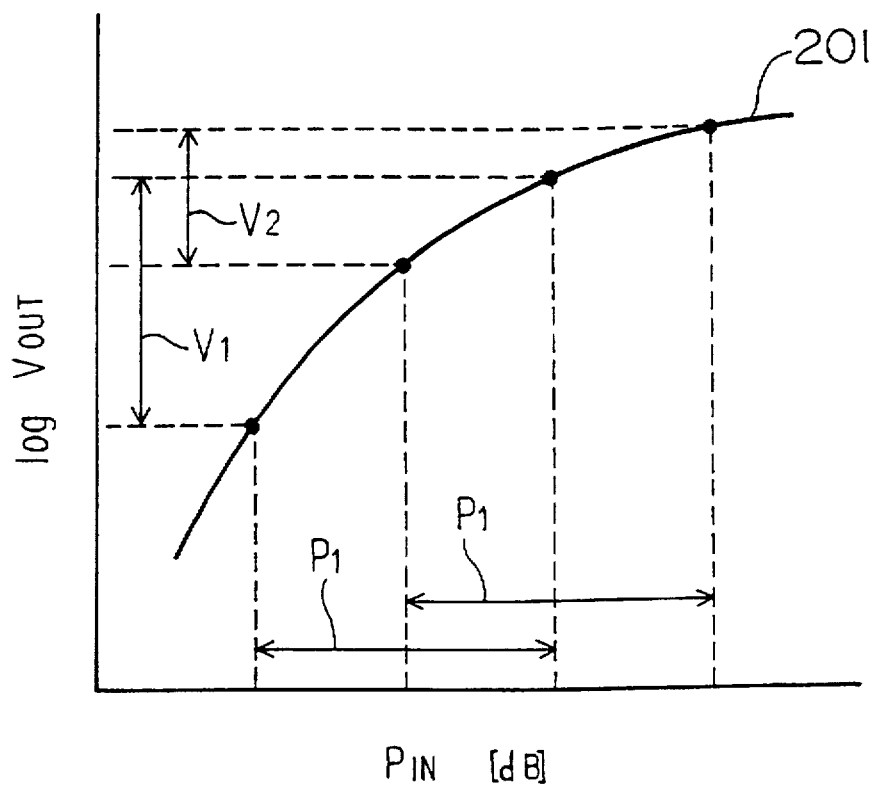
FIG. 18 describes operations of a compensator.

FIG. 12 is a block diagram to show a detailed structure of the sixth embodiment. Most constituents shown in FIG. 12 correspond to those in FIG. 2 as follows: a high-power amplifier 51 for the amplifier 11; a frequency converter 52 (labeled as "MIX" implying a mixer circuit) for the frequency converter 12; a programmable attenuator 53 for the programmable attenuator 13; an input signal splitter 54 for the input splitting means 14; an input signal detector 55 for the input detecting means 15; an output signal splitter 56 for the output splitting means 16; an attenuator 57 for the attenuation means 17; a frequency converter 58 for the frequency reconversion means 18; an output signal detector 59 for the output detecting means 19; and a combination of a difference sensing circuit 60 and a programmable attenuator controller 61 for the control means 20. The embodiment shown in FIG. 16 further incorporates an IF amplifier 62 and a local oscillator 63. The attenuator 57 is composed of passive elements and its attenuation factor can be set by manual. The input signal detector 55 and output signal detector 59 are the detectors whose structure and characteristics are equally as shown in FIGS. 16 and 17, respectively. The difference sensing circuit 60 detects a difference in amplitude between the outputs of the input signal detector 55 and output signal detector 59. The programmable attenuator controller 61 then adjusts the attenuation factor of the programmable attenuator 53 so as to reduce the detected amplitude difference as much as possible.

To be more specific, the programmable attenuator controller 61 adjusts the attenuation factor $L_V$ of the programmable attenuator 53 so that the inputs of the input signal detector 55 and the output signal detector 59 will have the same signal amplitude, namely, so as to satisfy the following Equation (5).

$$P_I - L_C = P_I + G_I - L_V - L_M + G_A - L_C - L_A - L_D \quad (5)$$

where $P_I$ is power of the input signal, $G_I$ is gain of the IF amplifier 62, $L_V$ is attenuation factor of the programmable attenuator 53, $L_M$ is conversion loss of the frequency converter 52, $G_A$ is gain of the high-power amplifier 51, $L_C$ is each coupling loss of the input signal splitter 54 and the output signal splitter 56, $L_A$ is attenuation factor of the attenuator 57, and $L_D$ is conversion loss of the frequency converter 58.

By rearranging Equation (5), the following Equation (6) is obtained.

$$L_V = G_I - L_M + G_A - L_A - L_D \quad (6)$$

This equation means that, when the programmable attenuator controller 61 adjusts the attenuation factor $L_V$ of the programmable attenuator 53 to be $(G_I - L_M + G_A - L_A - L_D)$, the inputs of the input signal detector 55 and the output signal detector 59 will have the same signal amplitude, and therefore, those detectors will work at well-matched operating points. Also, since the frequency converter 58 equalizes the frequencies of the input signal detector 55 and the output signal detector 59, those detectors can have the same detection characteristics. Because of thus equalized detection characteristics as well as well-matched operating points, non-linearity compensation is no longer necessary. Furthermore, even a change in the environmental conditions such as temperature will never degrade the high accuracy of gain control in this embodiment, because such a change will affect both of the input signal detector 55 and output signal detector 59 just in the same way in their detection characteristics and this results in canceling the effect of output drift due to the environmental change.

The total gain of a path from the input signal splitter 54 through to the output signal splitter 56 is expressed as the following Equation (7).

$$P_O - P_I = G_I - L_V - L_M + G_A \quad (7)$$

where $P_O$ is power of the output signal.

Substitution of Equation (6) into Equation (7) yields $$P_O - P_I = L_A + L_D \quad (8)$$

Above equations indicate that the total gain from the input signal splitter 54 to the output signal splitter 56 can be well-regulated to a constant value $(L_A + L_D)$, if the programmable attenuator controller 61 controls the attenuation factor Lv of the programmable attenuator 53 always to be $(G_I - L_M + G_A - L_A - L_D)$ compensating for a fluctuation of the gain $G_A$ of the high-power amplifier 51 and/or the gain $G_I$ of the IF amplifier 62 due to a temperature shift or a secular change. In addition, the total gain $(P_O - P_I)$ from the input signal splitter 54 to the output signal splitter 56 can be set to any value since the attenuation factor $L_A$ of the attenuator 57 is made variable.

Next, the following will describe a seventh embodiment which combines the third embodiment with the sixth embodiment.

Figure 13:
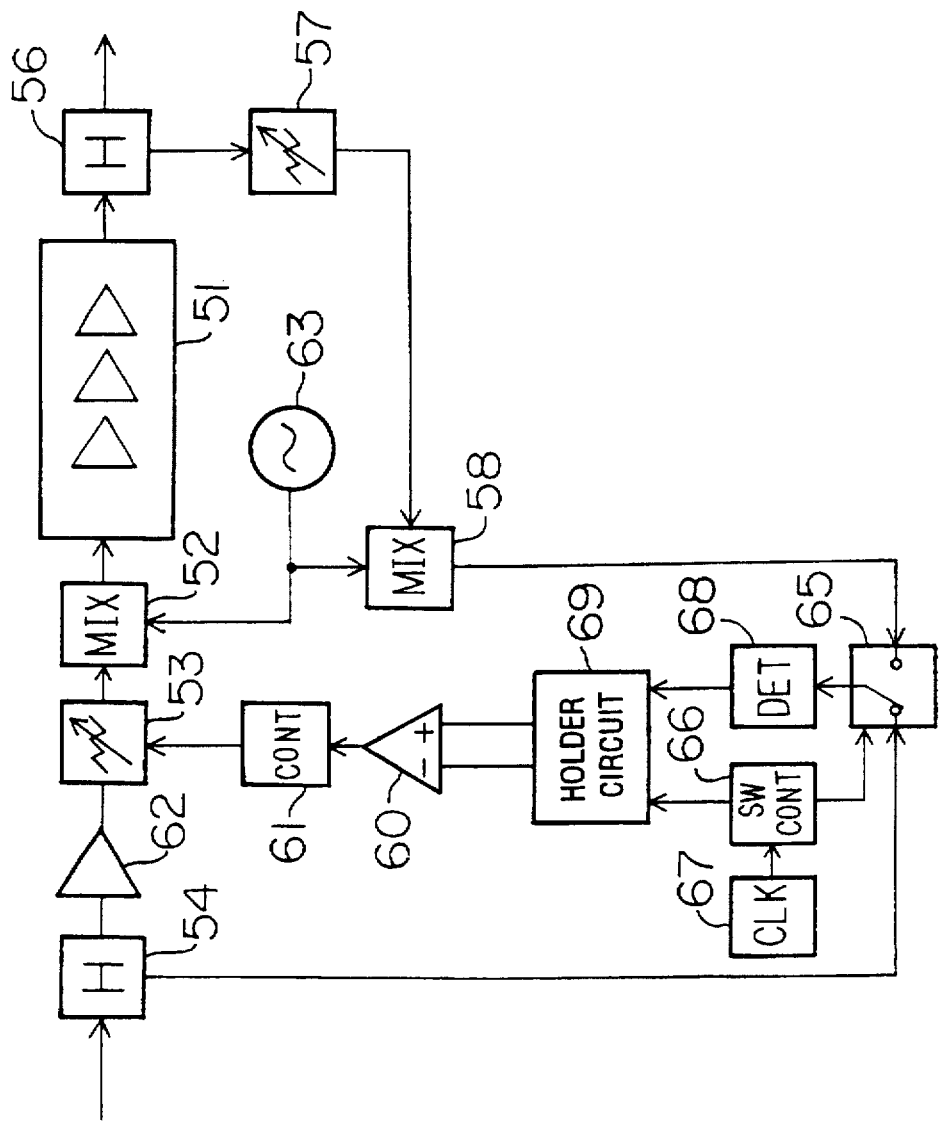
FIG. 13 is a schematic diagram to show a seventh embodiment.

FIG. 13 is a block diagram to show a structure of the seventh embodiment.

The sixth embodiment in FIG. 12 essentially required that the input signal detector 55 and the output signal detector 59 be identical in their detection characteristics. However, it is difficult to satisfy that requirement because there actually exists a kind of individuality, or a difference in the detection characteristics due to variations in electrical properties of components which organize the detector. To solve this problem, the seventh embodiment is configured so that a single detector will detect both input and output signal amplitudes. Since the seventh embodiment has a structure basically identical with the aforementioned sixth embodiment, the following will only explain about new elements but not duplicate the descriptions for the common constituents labeled with the same reference numerals as before.

In the seventh embodiment, the outputs of the input signal splitter 54 and frequency converter 58 are input to a selection switch 65. The selection switch 65 is provided with a selection signal from a selection signal generator 66 (labeled in FIG. 13 as "SW CONT" implying "switching control"). The selection signal generator 66 generates the selection signal at a predetermined interval $T_1$ based on a clock signal supplied by a clock generator 67. The selection switch 65, according to the selection signal, alternately selects an output signal from either the input signal splitter 54 or the frequency converter 58 at the predetermined interval $T_1$ and sends that switched signal to a detector 68. The detector 68 detects the switched signal to obtain its amplitude and sends it to a holder circuit 69. The holder circuit 69 incorporates two memorizing circuits, which are assigned for the respective outputs of the input signal splitter 54 and the frequency converter 58, and is provided with the selection signal from the selection signal generator 66. In synchronization with the selection signal, each of the two memorizing circuits in the holder circuit 36 memorizes the corresponding signal amplitudes as well as updating the signal amplitudes held therein with newly sampled ones. The difference sensing circuit 60 reads out the contents in those memorizing circuits and detects a difference in their levels.

This structural arrangement where the detector 68 solely detects the both signal amplitudes solves the problem due to individualities of detectors which was revealed in the sixth embodiment. Regarding the selection signal generated by the selection signal generator 66, the predetermined time interval $T_1$ can be on the order of a second since the temperature drift of amplifier gain is what the AGC circuit aims at as a main target of control.

To summarize the above-described embodiments, according to the present invention, attenuation means is inserted before output detecting means, and control means adjusts attenuation factor of a programmable attenuator, which actually determines the total gain, so that inputs to the input detecting means and output detecting means will have the same amplitude. This structure allows both the input detecting means and output detecting means to work at the same operating point. Having well-matched detection characteristics for those two detecting means as well as the equalized operating points, the AGC circuit can eliminate non-linearity compensation.

Furthermore, even if there is a change in their environmental conditions as temperature and the like, it will not produce an effect on the detection of amplitude difference between input and output, since such an environmental change affects both the input detecting means and output detecting means just in the same way in their detection characteristics and this results in canceling the effects of the change. The present invention thus promises a highly accurate gain control free from output drift due to a change of environmental conditions.

In case of an AGC circuit to control an amplifier which contains a frequency converter, frequency reconversion means is placed before the output detecting means and the frequency of the output-side signal to be detected by the output detecting means is reconverted to the same frequency of the input-side signal to be detected by the input detecting means. This equalized-frequency scheme allows those detecting means to have the same detection characteristics and also contributes to the gain control with high accuracy.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An AGC circuit to obtain a regulated gain, comprising:

input splitting means for splitting off an input sample signal from an input signal passing therethrough;

a programmable attenuator for attenuating the input signal passed through said input splitting means;

an amplifier for amplifying the input signal attenuated by said programmable attenuator;

output splitting means, coupled to said amplifier, for splitting off an output sample signal from an output signal of said amplifier;

attenuation means for attenuating the output sample signal provided by said output splitting means and thereby outputting an attenuated output sample signal;

selection means, coupled to both of said input splitting means and said attenuation means, for alternately selecting either the input sample signal or the attenuated output sample signal and thereby outputting a multiplexed sample signal;

detecting means for detecting the multiplexed sample signal selected by said selection means and thereby outputting a signal amplitude of the multiplexed sample signal;

first memorizing means for memorizing the signal amplitude that is output from said detecting means in response to the input sample signal selected by said selection means;

second memorizing means for memorizing the signal amplitude that is output from said detecting means in response to the attenuated output sample signal selected by said selection means; and control means, coupled to said programmable attenuator and said first and second memorizing means, for controlling an attenuation factor of said programmable attenuator based on the signal amplitudes memorized in said first and second memorizing means, so that the multiplexed sample signal will not fluctuate with time.

2. An AGC circuit according to claim 1, wherein said control means comprises:

difference detecting means for detecting an amplitude difference between an amplitude of the input sample signal and an amplitude of the attenuated output sample signal which are implied by the signal amplitude memorized in said memorizing means;

attenuation factor adjustment means for adjusting the attenuation factor of said programmable attenuation means based on the amplitude difference detected by said difference detection means so that the amplitude difference will decrease; and suppressing means for suppressing operations of said attenuation factor adjustment means when the amplitude difference detected by said difference detecting means exceeds a predetermined threshold.

3. An AGC circuit according to claim 1 to be used for a transmitter in which the number of transmission waves varies with time, wherein said selection means alternately selects either the input sample signal or the attenuated output sample signal at a predetermined interval that is shorter than a cycle time of changes of the number of the transmission waves, and said AGC circuit further comprises transmission-waves switching means for switching the number of the transmission waves in synchronization with the predetermined interval.

4. An AGC circuit to obtain a regulated gain, comprising:

input splitting means for splitting off an input sample signal from an input signal passing therethrough;

a programmable attenuator for attenuating the input signal passed through said input splitting means;

a frequency converter for converting a first frequency of the input signal attenuated by said programmable attenuator to a second frequency;

an amplifier for amplifying the input signal converted to the second frequency by said frequency converter and thereby outputting an output signal having the second frequency;

output splitting means for splitting off an output sample signal from the output signal of said amplifier;

attenuation means for attenuating the output sample signal provided by said output splitting means and thereby outputting an attenuated output sample signal;

frequency reconversion means, coupled to said attenuation means, for reconverting frequency of the attenuated output sample signal to the first frequency;

selection means, coupled to both of said input splitting means and said frequency reconversion means, for alternately selecting either the input sample signal or the attenuated output sample signal that is reconverted by said frequency reconversion means and thereby outputting a multiplexed sample signal;

detecting means for detecting the multiplexed sample signal selected by said selection means and thereby outputting a signal amplitude of the multiplexed sample signal;

memorizing means for memorizing the signal amplitude output from said detecting means; and control means, coupled to said programmable attenuator and said memorizing means, for controlling an attenuation factor of said programmable attenuator based on the signal amplitude memorized in said memorizing means, so that the multiplexed sample signal will not fluctuate with time.

* * * * *